US012785052B2

(12) United States Patent
Ota

(10) Patent No.: US 12,785,052 B2
(45) Date of Patent: Nov. 3, 2026

(54) SUBSTRATE PROCESSING APPARATUS

(71) Applicant: SPP Technologies Co., Ltd., Tokyo (JP)

(72) Inventor: Kazuya Ota, Amagasaki (JP)

(73) Assignee: SPP Technologies Co., Ltd., Tokyo (JP)

( * ) Notice: Subject to any disclaimer, the term of this patent is extended or adjusted under 35 U.S.C. 154(b) by 250 days.

(21) Appl. No.: 18/792,650

(22) Filed: Aug. 2, 2024

(65) Prior Publication Data

US 2024/0395515 A1 Nov. 28, 2024

Related U.S. Application Data

(63) Continuation of application No. PCT/JP2022/041217, filed on Nov. 4, 2022.

(30) Foreign Application Priority Data

Mar. 23, 2022 (JP) ................................ 2022-046507

(51) Int. Cl.
*H01J 37/32* (2006.01)

(52) U.S. Cl.
CPC ..... *H01J 37/32899* (2013.01); *H01J 37/3211* (2013.01); *H01J 2237/002* (2013.01)

(58) Field of Classification Search
CPC ........... H01J 37/32522; H01J 37/32899; H01J 37/3211; H01J 37/321; H01J 37/32357; H01J 37/32458; H01J 37/32889; H01J 2237/002; H10P 50/242; H10P 14/60; H10P 72/0421
USPC .................... 118/723, 1, 723 IR; 156/345.48
See application file for complete search history.

(56) References Cited

U.S. PATENT DOCUMENTS

| | | | |
|---|---|---|---|
| 6,899,786 | B2 | 5/2005 | Senzaki et al. |
| 7,481,903 | B2 | 1/2009 | Senzaki et al. |
| 8,771,461 | B2 | 7/2014 | Hayami et al. |
| 2004/0211924 | A1 | 10/2004 | Tanaka et al. |
| 2005/0103445 | A1 | 5/2005 | Brcka et al. |
| 2011/0005684 | A1 | 1/2011 | Hayami et al. |
| 2013/0087286 | A1 | 4/2013 | Carducci et al. |
| 2014/0345528 | A1 | 11/2014 | Yang et al. |
| 2017/0229290 | A1 | 8/2017 | Kobayashi et al. |

(Continued)

FOREIGN PATENT DOCUMENTS

| | | |
|---|---|---|
| JP | 2004-311887 A | 11/2004 |
| JP | 2007-525798 A | 9/2007 |

(Continued)

OTHER PUBLICATIONS

International Search Report (PCT/ISA/210) issued in PCT Application No. PCT/JP2022/041217 dated Jan. 24, 2023 with English translation (5 pages).

(Continued)

*Primary Examiner* — Rodney G McDonald
(74) *Attorney, Agent, or Firm* — Crowell & Moring LLP

(57) ABSTRACT

A substrate processing apparatus includes a lower chamber, an upper chamber, and a lift mechanism. The upper chamber includes a first assembly, a second assembly, and a lock mechanism to releasably couple the first assembly to the second assembly. The first assembly includes a top plate and a first cover, and is coupled to the lift mechanism from an outside of the first cover. The lock mechanism is on a position closer to an inner periphery than a peripheral side of the first cover of the first assembly.

18 Claims, 8 Drawing Sheets

(56) References Cited

U.S. PATENT DOCUMENTS

| | | | |
|---|---|---|---|
| 2019/0237302 | A1 | 8/2019 | Kobayashi et al. |
| 2021/0151298 | A1 | 5/2021 | Kobayashi et al. |

FOREIGN PATENT DOCUMENTS

| | | | |
|---|---|---|---|
| JP | 2008-306042 | A | 12/2008 |
| JP | 2009-224432 | A | 10/2009 |
| JP | 2011-253842 | A | 12/2011 |
| JP | 4896337 | B2 | 3/2012 |
| JP | 5188849 | B2 | 4/2013 |
| JP | 2013-84602 | A | 5/2013 |
| JP | 2015-503247 | A | 1/2015 |
| JP | 2017-143186 | A | 8/2017 |
| JP | 2021-174952 | A | 11/2021 |

OTHER PUBLICATIONS

Japanese-language Written Opinion (PCT/ISA/237) issued in PCT Application No. PCT/JP2022/041217 dated Jan. 24, 2023 with English translation (5 pages).

Korean-language Office Action issued in Korean Application No. 10-2024-7021972 dated Feb. 26, 2026 with English translation (4 pages).

(COMPARATIVE EXAMPLE 1)

(COMPARATIVE EXAMPLE 2)

SUBSTRATE PROCESSING APPARATUS

CROSS-REFERENCE TO RELATED APPLICATION

This application is a continuation of PCT application PCT/JP2022/041217, filed on Nov. 4, 2022, which is based upon and claims priority of Japanese patent application No. 2022-046507, filed on Mar. 23, 2022, the entire contents of which are incorporated herein by reference.

TECHNICAL FIELD

The present invention relates to a substrate processing apparatus, and more particularly, it relates to a substrate processing apparatus including a dividable upper chamber that is an upper unit.

BACKGROUND

Conventionally, a substrate processing apparatus including a dividable upper unit is known. Such a substrate processing apparatus is disclosed in Japanese Patent No. 4896337 and Japanese Patent No. 5188849, for example.

Japanese Patent No. 4896337 discloses a substrate processing apparatus including an upper electrode unit to define a ceiling of a processing chamber, and a lift mechanism to raise and lower the upper electrode unit. The upper electrode unit includes an upper assembly and a lower assembly that can be separated and united by only a lock mechanism provided on the outer peripheral surface of the upper electrode unit. In Japanese Patent No. 4896337, during maintenance of the substrate processing apparatus, the upper assembly and the lower assembly can be integrally raised when the lock mechanism is locked, and only the upper assembly can be raised by the lift mechanism when the lock mechanism is unlocked.

Japanese patent No. 5188849 discloses a plasma processing apparatus including a processing chamber that includes an upper chamber and a lower chamber, an elevating board to which a portion of the upper chamber is attached, elevating means to raise and lower the elevating board, and a plurality of fixing bolts to fix the upper chamber. The upper chamber includes an annular plate, a cylindrical sidewall member placed on the annular plate, plasma generating means arranged outside the sidewall member and fixed to the lower surface of the elevating board, and a top plate placed on the sidewall member, and the elevating board, the elevating means, the plurality of fixing bolts, and the upper chamber are housed in an upper cover with a door. In Japanese Patent No. 5188849, a member of the upper chamber fixed to the elevating board via the fixing bolts can be separated from other members and raised by a lift mechanism. In other words, during maintenance, depending on the attachment condition or the detachment condition of the plurality of fixing bolts, the top plate and the plasma generating means can be raised without raising the annular plate and the sidewall member of the upper chamber, or the top plate, the sidewall member, the plasma generating means, and the annular plate can be integrally raised.

SUMMARY

Although not disclosed in Japanese Patent No. 4896337 and Japanese Patent No. 5188849, a sidewall of a chamber of a substrate processing apparatus becomes hot during substrate processing, and thus safety standards or the like require that a user be prevented from coming into contact with a high-temperature portion. In addition, the safety standards or the like require that the user be prevented from unintentionally coming into contact with portions that are operable by the user and are important for the normal functioning of the substrate processing apparatus, such as the lock mechanism disclosed in Japanese Patent No. 4896337 and the fixing bolts disclosed in Japanese Patent No. 5188849, when there is a risk that a heavy object may fall due to unlocking while ascending or descending, for example.

In Japanese Patent No. 4896337, protection for such a high-temperature portion and protection for the lock mechanism is not particularly considered, and thus when an apparatus that complies with the safety standards is actually configured, it is necessary to separately provide members such as protective covers for contact prevention around high-temperature portions of the upper and lower assemblies and around the lock mechanism. Therefore, the configuration of the apparatus becomes complex, and the outer diameter dimension of the apparatus increases due to the provision of the protective covers or the like.

On the other hand, in Japanese Patent No. 5188849, each portion of the upper chamber fixed with the fixing bolts and the elevating means are housed in the upper cover with a door, and thus this upper cover conceivably protects a high-temperature portion and a lock mechanism. However, in such a case, a large cover is provided to cover the entire upper chamber and elevating means, and thus the outer diameter dimension of the apparatus increases. Furthermore, during maintenance, a worker must reach into the upper cover through the door of the upper cover to detach and attach the fixing bolts, etc. but since the lift mechanism etc. are provided inside the upper cover, it is necessary to detach and attach the fixing bolts through a gap between components of the lift mechanism. Therefore, there is room for improvement in the operability of the lock mechanism.

The present invention is intended to solve at least one of the above problems. The present invention aims to provide a substrate processing apparatus capable of reducing or preventing an increase in the outer diameter dimension of the apparatus while ensuring protective structures for a high-temperature portion and a lock mechanism, and improving the operability of the lock mechanism.

In order to attain the aforementioned object, a substrate processing apparatus according to a first invention includes a lower chamber including a reaction chamber to process a substrate, an upper chamber to cover an upper portion of the lower chamber, and a lift mechanism to attach and detach the upper chamber to and from the lower chamber. The upper chamber includes a first assembly on an upper side, a second assembly on a lower surface of the first assembly, and a lock mechanism to releasably couple the first assembly to the second assembly. The first assembly includes a top plate and a first cover to openably cover an upper surface of the top plate, and is coupled to the lift mechanism from an outside of the first cover. The second assembly includes a plasma generation chamber coupled to the reaction chamber to define a closed space, and a cylindrical second cover to cover an outer periphery of the plasma generation chamber. The lock mechanism is on a position closer to an inner periphery than a peripheral side of the first cover of the first assembly.

In the substrate processing apparatus according to the first invention, as described above, the first cover and the second cover are provided on the first assembly and the second assembly of the upper chamber, respectively, and the lock mechanism is provided on a position closer to the inner periphery than the peripheral side of the first cover of the first assembly. Accordingly, the first cover can protect the lock mechanism while the first cover and the second cover protect high-temperature portions. Thus, the lock mechanism is not exposed on the outer surface of the first cover, and thus it is not necessary to separately provide a protective cover or the like for the lock mechanism. Therefore, an increase in the outer diameter dimension of the apparatus can be reduced or prevented while the configuration of the apparatus does not become complex. Furthermore, with a configuration in which the first cover and the second cover are provided separately, and the first assembly is coupled to the lift mechanism from the outside of the first cover, as compared with a configuration in which the upper chamber is housed together with the lift mechanism within the cover, spaces to be ensured within the covers can be reduced, and thus the dimensions (volumes) of the first cover and the second cover can be reduced. Moreover, the lift mechanism is not located in the cover, and thus it is not necessary to operate the lock mechanism through a gap between components of the lift mechanism. Therefore, the operability of the lock mechanism can be improved within the cover. Consequently, according to the present invention, it is possible to reduce or prevent an increase in the outer diameter dimension of the apparatus while ensuring protective structures for the high-temperature portions and the lock mechanism and improve the operability of the lock mechanism.

A substrate processing apparatus according to a second invention includes a lower chamber including a reaction chamber to process a substrate, an upper chamber to cover an upper portion of the lower chamber, and a lift mechanism to attach and detach the upper chamber to and from the lower chamber. The upper chamber includes a first assembly on an upper side, a second assembly on a lower surface of the first assembly, and a lock mechanism to releasably couple the first assembly to the second assembly. The first assembly includes a top plate, a first cover to openably cover an upper surface of the top plate, and a top board to define a ceiling surface of a plasma generation chamber coupled to the reaction chamber to define a closed space, and is coupled to the lift mechanism from an outside of the first cover. The second assembly includes a cylindrical sidewall to define an inner peripheral surface of the plasma generation chamber, and a cylindrical second cover to cover an outer periphery of the plasma generation chamber. The lock mechanism is on a position closer to an inner periphery than a peripheral side of the first cover of the first assembly.

In the substrate processing apparatus according to the second invention, as described above, the first cover and the second cover are provided on the first assembly and the second assembly of the upper chamber, respectively, and the lock mechanism is provided on a position closer to the inner periphery than the peripheral side of the first cover of the first assembly. Accordingly, the first cover can protect the lock mechanism while the first cover and the second cover protect high-temperature portions. Thus, the lock mechanism is not exposed on the outer surface of the first cover, and thus it is not necessary to separately provide a protective cover or the like for the lock mechanism. Therefore, an increase in the outer diameter dimension of the apparatus can be reduced or prevented while the configuration of the apparatus does not become complex. Furthermore, with a configuration in which the first cover and the second cover are provided separately, and the first assembly is coupled to the lift mechanism from the outside of the first cover, as compared with a configuration in which the upper chamber is housed together with the lift mechanism within the cover, spaces to be ensured within the covers can be reduced, and thus the dimensions (volumes) of the first cover and the second cover can be reduced. Moreover, the lift mechanism is not located in the cover, and thus it is not necessary to operate the lock mechanism through a gap between components of the lift mechanism. Therefore, the operability of the lock mechanism can be improved within the cover. Consequently, according to the present invention, it is possible to reduce or prevent an increase in the outer diameter dimension of the apparatus while ensuring protective structures for the high-temperature portions and the lock mechanism and improve the operability of the lock mechanism.

A substrate processing apparatus according to a third invention includes a lower chamber including a reaction chamber to process a substrate, an upper chamber to cover an upper portion of the lower chamber, and a lift mechanism to attach and detach the upper chamber to and from the lower chamber. The upper chamber includes a first assembly on an upper side, a second assembly on a lower surface of the first assembly, and a lock mechanism to releasably couple the first assembly to the second assembly. The first assembly includes a top plate and a first cover to openably cover an upper surface of the top plate, and is coupled to the lift mechanism from an outside of the first cover. The second assembly includes a cylindrical second cover to cover an outer periphery of a plasma generation chamber coupled to the reaction chamber to define a closed space. The lock mechanism is on a position closer to an inner periphery than a peripheral side of the first cover of the first assembly.

In the substrate processing apparatus according to the third invention, as described above, the first cover and the second cover are provided on the first assembly and the second assembly of the upper chamber, respectively, and the lock mechanism is provided on a position closer to the inner periphery than the peripheral side of the first cover of the first assembly. Accordingly, the first cover can protect the lock mechanism while the first cover and the second cover protect high-temperature portions. Thus, the lock mechanism is not exposed on the outer surface of the first cover, and thus it is not necessary to separately provide a protective cover or the like for the lock mechanism. Therefore, an increase in the outer diameter dimension of the apparatus can be reduced or prevented while the configuration of the apparatus does not become complex. Furthermore, with a configuration in which the first cover and the second cover are provided separately, and the first assembly is coupled to the lift mechanism from the outside of the first cover, as compared with a configuration in which the upper chamber is housed together with the lift mechanism within the cover, spaces to be ensured within the covers can be reduced, and thus the dimensions (volumes) of the first cover and the second cover can be reduced. Moreover, the lift mechanism is not located in the cover, and thus it is not necessary to operate the lock mechanism through a gap between components of the lift mechanism. Therefore, the operability of the lock mechanism can be improved within the cover. Consequently, according to the present invention, it is possible to reduce or prevent an increase in the outer diameter dimension of the apparatus while ensuring protective structures for the high-temperature portions and the lock mechanism and improve the operability of the lock mechanism.

In the substrate processing apparatus according to any one of the first to third inventions, the first assembly preferably includes a valve mechanism, a cooling mechanism, and a heating mechanism, all of which are on the top plate, and the second assembly preferably includes, on an inner peripheral side of the second cover, a coil around the plasma generation chamber to generate a magnetic field to turn a processing gas in the plasma generation chamber into plasma. Accordingly, when the first assembly is raised, the mechanisms (the valve mechanism, the cooling mechanism, and the heating mechanism) mounted on the first assembly can be collectively separated from the second assembly while the coil of the plasma generation chamber is allowed to remain on the second assembly side.

In the substrate processing apparatus according to any one of the first to third inventions, the lock mechanism is preferably operable to switch between a coupled state in which the first assembly and the second assembly are coupled to each other such that both the first assembly and the second assembly are separable from the lower chamber by the lift mechanism and an uncoupled state in which the first assembly and the second assembly are not coupled to each other such that the first assembly is separable from the second assembly and the lower chamber by the lift mechanism. Accordingly, the coupled state and the uncoupled state can be switched simply by operating the lock mechanism.

In this case, the lock mechanism preferably includes a switching lever on the top plate within the first cover, and is preferably operable to switch between the coupled state and the uncoupled state depending on a position of the switching lever. Accordingly, unlike a configuration that locks with a bolt or the like, the lock mechanism can be switched between the coupled state and the uncoupled state extremely easily and quickly by operating the switching lever.

In this case, the lock mechanism is preferably on a position closer to an inner periphery than a peripheral side of the second cover of the second assembly, the second cover preferably includes a flange protruding inward from an inner peripheral surface of the second cover, and the lock mechanism preferably includes a shaft penetrating the top plate in an upward-downward direction, an engagement portion at a lower end of the shaft, and an insertion port penetrating the flange of the second cover in the upward-downward direction. When the switching lever is in a locked position, the engagement portion is preferably located in a position in which the engagement portion engages with an edge of the insertion port such that the lock mechanism is in the coupled state, and when the switching lever is in an unlocked position, the engagement portion is preferably located in a position in which the engagement portion does not engage with the edge of the insertion port such that the lock mechanism is in the uncoupled state. Accordingly, the lock mechanism can be achieved with a simple configuration in which the shaft is inserted into the insertion port to change the engagement state between the engagement portion and the edge of the insertion port. Furthermore, the lock mechanism can be made into an elongated shaft-shaped structure that extends in the upward-downward direction as a whole, and thus even when the lock mechanism is provided on the inner peripheral side of the first cover and the second cover, an increase in the outer diameter dimensions of the first cover and the second cover can be effectively reduced or prevented.

In the substrate processing apparatus according to any one of the first to third inventions, the lift mechanism is preferably coupled to the top plate from an outside of the upper chamber. For example, when the first cover is coupled to the lift mechanism, it becomes necessary to ensure that the first cover has a rigidity required to support the weight, and the first cover is likely to become large in order to ensure the rigidity. In contrast, in the above configuration, the top plate functions as a component that ensures the rigidity of the first assembly, and thus the size and weight of the first cover can be reduced.

The above and other elements, features, steps, characteristics and advantages of the present invention will become more apparent from the following detailed description of the example embodiments with reference to the attached drawings.

DETAILED DESCRIPTION

Figure 1:
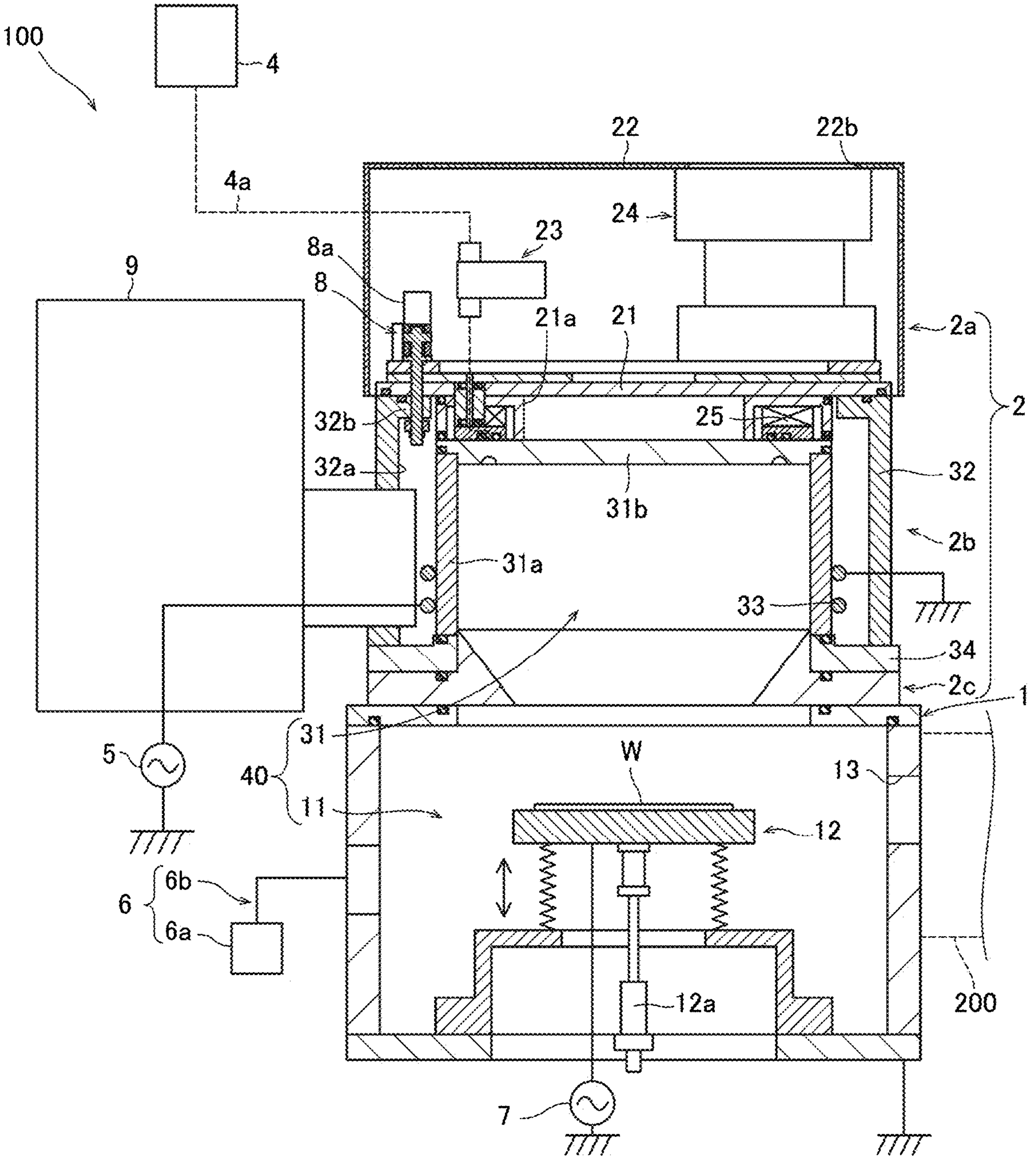
FIG. 1 is a sectional view schematically showing the configuration of a substrate processing apparatus.

An embodiment of the present invention is hereinafter described on the basis of the drawings.

Substrate Processing Apparatus

A substrate processing apparatus 100 according to this embodiment is now described with reference to FIG. 1. The substrate processing apparatus 100 is a plasma processing apparatus that dry-etches on a substrate W by forming plasma in a closed space 40, and more specifically, it is an inductively coupled plasma (ICP) etching apparatus. The substrate W is a silicon wafer made of silicon, for example. The substrate processing apparatus 100 includes a lower chamber 1, an upper chamber 2, and a lift mechanism 3 (see FIG. 2). The substrate processing apparatus 100 also includes a gas supply device 4, a high-frequency power source 5, an exhaust device 6, and a high-frequency power source 7.

The lower chamber 1 includes a reaction chamber 11 in which the substrate W is processed. An upper portion of the lower chamber 1 is covered by the upper chamber 2. A plasma generation chamber 31 (described below) of the upper chamber 2 and the reaction chamber 11 are coupled to (communicated with) each other to define the closed space 40, which is a closed space.

A susceptor 12 is installed within the reaction chamber 11. The substrate W to be processed is placed on the susceptor 12. The lower chamber 1 includes an inlet/outlet 13 for the substrate W, and the substrate W is transported by a transport device 200 (see FIG. 2). The susceptor 12 is movable up and down by a lift cylinder 12*a* within the closed space 40. The susceptor 12 includes internal piping (not shown) through which a coolant is circulated by a chiller device (not shown) that circulates the coolant, and during plasma processing, the susceptor 12 is cooled by the coolant.

The high-frequency power source 7 supplies high-frequency power to the susceptor 12. The high-frequency power source 7 applies a bias potential between the susceptor 12 and the plasma by supplying high-frequency power.

The reaction chamber 11 is connected to the exhaust device 6 that reduces a pressure within the closed space 40. A vacuum pump 6*a* of the exhaust device 6 exhausts a gas in the closed space 40 through an exhaust pipe 6*b* to bring the inside of the closed space 40 into a vacuum state. Regions other than the closed space 40 in the substrate processing apparatus 100 are atmospheric regions.

The upper chamber 2 includes a first assembly 2*a* on the upper side, a second assembly 2*b* provided on the lower surface of the first assembly 2*a*, and lock mechanisms 8 to releasably couple the first assembly 2*a* to the second assembly 2*b*. The first assembly 2*a* and the second assembly 2*b* are coupled to each other by the lock mechanisms 8 such that they can be separated and united. The upper chamber 2 further includes a third assembly 2*c* provided on the lower surface of the second assembly 2*b*.

Figure 2:
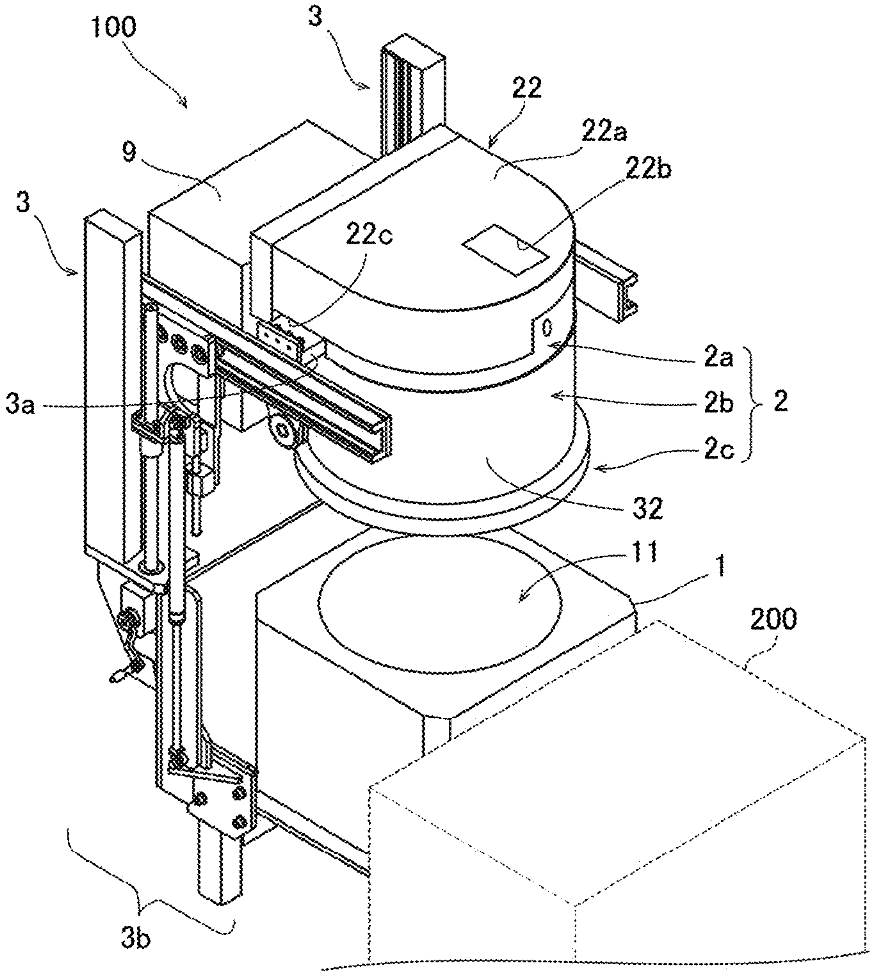
FIG. 2 is a perspective view schematically showing an upper chamber moved to a raised position.

As shown in FIG. 2, the lift mechanism 3 can attach and detach the upper chamber 2 to and from the lower chamber 1. The lift mechanism 3 is provided to support the upper chamber 2 from both sides by a pair of vertical shafts 3*b*. The lift mechanism 3 supports the upper chamber 2 such that the upper chamber 2 is movable at least in an upward-downward direction. The lift mechanism 3 can move the upper chamber 2 along the vertical shafts 3*b* to a lowered position (see FIG. 1) on the upper surface of the lower chamber 1 and a raised position (see FIG. 2) upwardly away from the lower chamber 1. When with respect to the upper chamber 2 and the lower chamber 1, the transport device 200 side is defined as a forward direction, the storage 9 (described below) side is defined as a rearward direction, and a direction perpendicular to the forward direction and the rearward direction in a horizontal plane is defined as a right-left direction, the pair of vertical shafts 3*b* are spaced apart from the upper chamber 2 and the lower chamber 1 in the rearward direction. Therefore, the vertical shafts 3*b* of the lift mechanism 3 do not interfere with maintenance work on the upper chamber 2 and the lower chamber 1 by a worker from the right-left direction.

Returning to FIG. 1, the lock mechanisms 8 switch between a coupled state and an uncoupled state. In the coupled state (see FIGS. 1, 2, and 8), the first assembly 2*a* is coupled to the second assembly 2*b* such that both the first assembly 2*a* and the second assembly 2*b* are separable from the lower chamber 1 by the lift mechanism 3. In the uncoupled state (see FIG. 9), the first assembly 2*a* is not coupled to the second assembly 2*b* such that the first assembly 2*a* is separable from the second assembly 2*b* and the lower chamber 1 by the lift mechanism 3.

First Assembly

Figure 3:
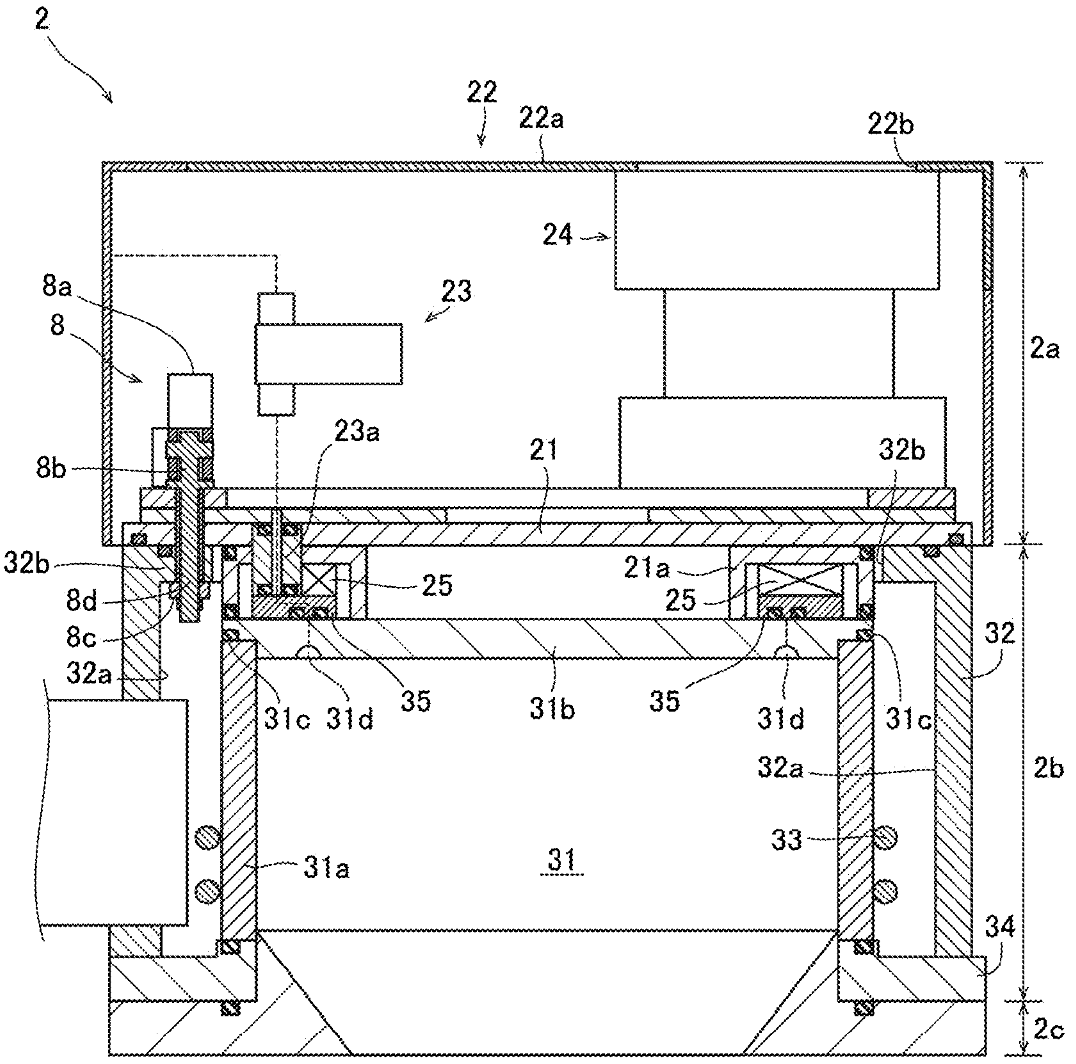
FIG. 3 is a sectional view for schematically illustrating the structure of the upper chamber.

As shown in FIG. 3, the first assembly 2*a* includes a top plate 21 and a first cover 22 to openably cover the upper surface of the top plate 21.

The top plate 21 is a flat plate member that serves as a base for the first assembly 2*a*. Each component of the first assembly 2*a* is assembled to the top plate 21 directly or indirectly. The first cover 22 is provided on the top plate 21. The first cover 22 has a side surface extending in the upward-downward direction along the outer periphery of the top plate 21 and an upper surface extending horizontally from an upper end of the side surface, and surrounds and covers the upper surface of the top plate 21. At least a portion of the first cover 22 is attachable and detachable to and from (or openable and closable relative to) the top plate 21. In this embodiment, a portion of the side surface of the first cover 22 is fixed to the top plate 21. A separable portion 22*a* (see FIG. 2) that includes most of the upper surface of the first cover 22 is detachably attached to the portion fixed to the top plate 21.

The first assembly 2*a* includes a valve mechanism 23, a cooling mechanism 24, and a heating mechanism 25 that are provided on the top plate 21.

The valve mechanism 23 includes a valve to control a supply of a processing gas to be supplied into the plasma generation chamber 31. The valve mechanism 23 (see FIG. 1) is connected to the gas supply device 4 installed outside the first assembly 2*a* by a supply pipe 4*a*. The valve mechanism 23 is also connected to an attachment 23*a* that is detachably attached to a distributor 35 (described below) of the second assembly 2*b* via a pipe member (indicated by a dotted line). The valve mechanism 23 connects the gas supply device 4 to the inside of the plasma generation chamber 31 via the attachment 23*a* and the distributor 35. This allows the gas supply device 4 to supply the processing gas (etching gas) into the closed space 40 via the valve mechanism 23.

The cooling mechanism 24 has a function of releasing heat generated during substrate processing. The cooling mechanism 24 includes a built-in cooling fan, and exhausts air heated in the atmospheric region of the upper chamber 2 to the outside through a ventilation hole 22*b* provided on the upper surface of the first cover 22. The heating mechanism 25 is a heater provided on the lower surface side of the top plate 21 and configured to heat components (a top board 31*b* and a sidewall 31*a*) that define the plasma generation chamber 31 of the second assembly 2*b*. A protrusion 21*a* to which the heating mechanism 25 is attached is provided on the lower surface of the top plate 21. The protrusion 21*a* contacts the upper surface of the top board 31*b*. The heating mechanism 25 is provided on the lower surface side of the protrusion 21*a*, contacts the distributor 35 provided on the upper surface of the top board 31*b*, and transfers heat to the top board 31*b*.

Figure 4:
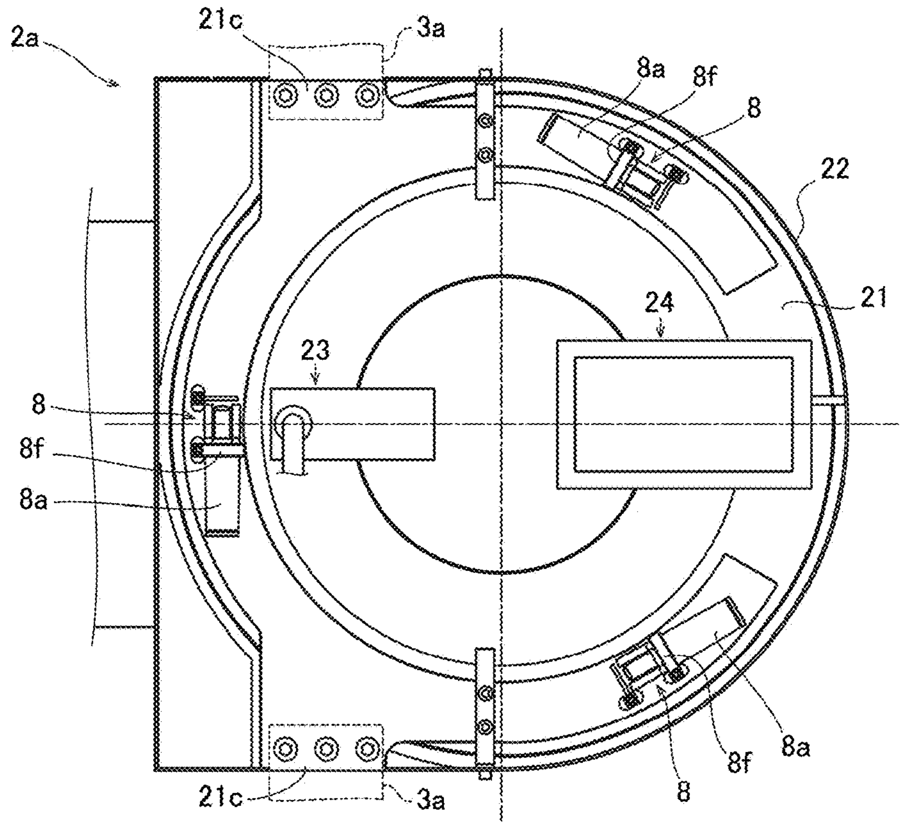
FIG. 4 is a plan view schematically showing the inside of a first cover of a first assembly.

As shown in FIG. 2, the first assembly 2*a* is coupled to the lift mechanism 3 from an outside of the first cover 22. Specifically, the lift mechanism 3 is coupled to the top plate 21 from an outside of the upper chamber 2. That is, as shown in FIG. 4, a mount 21*c* is provided on each side (both upper and lower sides in FIG. 4) of the top plate 21 to connect to a mounting bracket 3*a* of the lift mechanism 3. The mounting bracket 3*a* (see FIG. 2) of the lift mechanism 3 is fixed to the mount 21*c* by bolts. The first cover 22 includes a notch 22*c* (see FIG. 2) to allow the mounting bracket 3*a* to be inserted into the mount 21*c*.

The lock mechanisms 8 are provided on the top plate 21. As shown in FIG. 4, the lock mechanisms 8 are provided at three locations on the top plate 21 at substantially equal angles along the circumferential direction of the first assembly 2*a*. The substrate processing apparatus 100 includes three lock mechanisms 8 having the same configuration.

Second Assembly

Returning to FIG. 3, the second assembly 2*b* includes the plasma generation chamber 31 coupled to the reaction chamber 11 to define the closed space 40, and a cylindrical second cover 32 to cover the outer periphery of the plasma generation chamber 31. The second assembly 2*b* also includes a storage 9 (see FIG. 1) to house electrical circuitry outside (rear side) of the second cover 32. The storage 9 includes a matching box connected to the high-frequency power source 5, for example. The matching box provides impedance matching between the high-frequency power source 5 and a coil 33.

The second assembly 2*b* includes, on the inner peripheral side of the second cover 32, the cylindrical sidewall 31*a* to define the inner peripheral surface of the plasma generation chamber 31, the top board 31*b* to define the ceiling surface of the plasma generation chamber 31, and the coil 33 provided around the plasma generation chamber 31 to generate a magnetic field to turn the processing gas in the plasma generation chamber 31 into plasma. The second assembly 2*b* includes an annular (flat plate-shaped with an opening formed in the center) support plate 34 to support these members.

The sidewall 31*a* is a cylindrical member made of a dielectric material (aluminum oxide). A lower end of the sidewall 31*a* is supported by the support plate 34. The top board 31*b* is a disk member placed on an upper end of the sidewall 31*a*. A boundary between the top board 31*b* and the upper end surface of the sidewall 31*a* is sealed via a seal member 31*c*. A plurality of openings 31*d* for gas introduction are provided in the circumferential direction on the lower surface of the top board 31*b* (the inner surface of the plasma generation chamber 31), and the distributor 35 is provided on the upper surface of the top board 31*b*. The processing gas supplied via the valve mechanism 23 is introduced into the plasma generation chamber 31 from the openings 31*d* through a gas flow path (not shown) provided in the distributor 35 and the top board 31*b*.

The coil 33 is spirally wound along the outer peripheral surface of the sidewall 31*a*. A plurality of insulating columnar holding members (not shown) are provided on the upper surface of the support plate 34 around the entire periphery of the sidewall 31*a*, and the coil 33 is fixed to the holding members. As shown in FIG. 1, the coil 33 is connected to the high-frequency power source 5 via the matching box (circuitry) in the storage 9. When high-frequency power is supplied from the high-frequency power source 5 to the coil 33, the processing gas supplied into the plasma generation chamber 31 is turned into plasma.

As shown in FIG. 3, the second cover 32 surrounds the outer periphery of the top board 31*b* and the sidewall 31*a*. The second cover 32 is spaced apart from the plasma generation chamber 31 and the coil 33 and is not in contact with them. The second cover 32 includes screw holes (not shown) at its lower end, and is fastened to the outer periphery of the support plate 34 by bolts (not shown) inserted from the lower surface side into through-holes (not shown) of the support plate 34 and screwed into the screw holes.

The protrusion 21*a* of the top plate 21 described above contacts the top board 31*b* inside the second cover 32. The lower surface of the outer periphery of the top plate 21 is placed on the upper end surface of the second cover 32. The second cover 32 includes a flange 32*b* protruding inward from the inner peripheral surface 32*a* of the second cover 32. The flange 32*b* is provided on an upper end of the second cover 32 and extends along the lower surface of the top plate 21.

In the upper chamber 2 configured as above, high-temperature portions that become hot during processing of the substrate W (see FIG. 1) are mainly the plasma generation chamber 31 (the sidewall 31*a* and the top board 31*b*), the coil 33, and the heating mechanism 25. These high-temperature portions are surrounded by the second cover 32 to prevent a worker from unintentionally coming into contact with them.

The lock mechanisms 8 are operable by a user and are important for the normal functioning of the substrate processing apparatus 100. The lock mechanisms 8 are located inside the first cover 22 and the second cover 32, and thus the worker is prevented from unintentionally coming into contact with the lock mechanisms 8.

Third Assembly

The third assembly 2*c* is an annular member, and the inner periphery of the third assembly 2*c* protrudes radially inward to narrow the opening diameter of a connection between the plasma generation chamber 31 and the reaction chamber 11. The third assembly 2*c* is detachably attached to the support plate 34 by bolts (not shown). The lower surface of the third assembly 2*c* is placed on the upper surface (see FIG. 1) of the lower chamber 1. In the configuration according to this embodiment, the lower surface of the third assembly 2*c* becomes the lowermost surface of the upper chamber 2.

Lock Mechanisms

Figure 5:
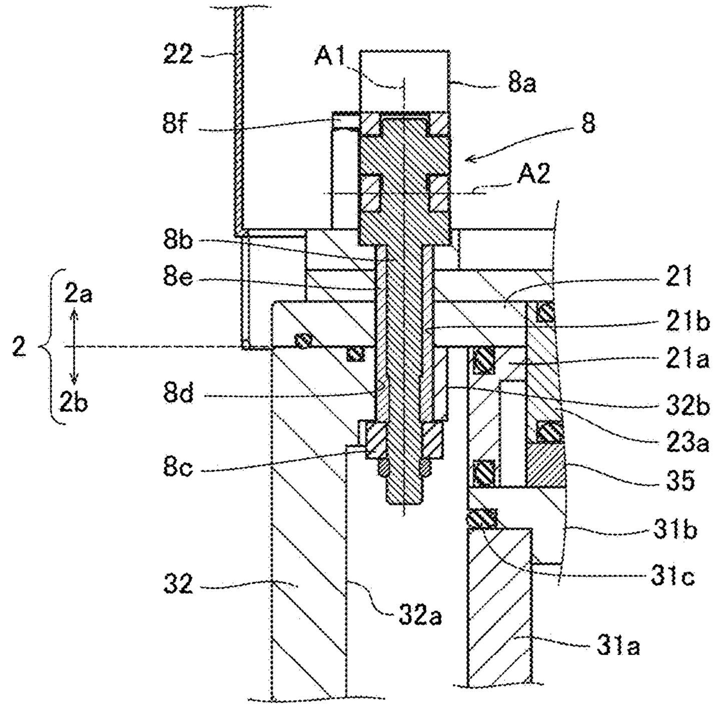
FIG. 5 is a sectional view for schematically illustrating the structure of a lock mechanism.

The three lock mechanisms 8 (see FIG. 4) are provided on a position closer to the inner periphery (radially inward) than the peripheral side of the first cover 22 of the first assembly 2*a*. The lock mechanisms 8 are also provided on a position closer to the inner periphery (radially inward) than the peripheral side of the second cover 32 of the second assembly 2*b*. As shown in FIG. 5, the lock mechanisms 8 are located on a position closer to inside than the outer peripheral surface and the inner peripheral surface of the first cover 22, and on a position closer to inside than the outer peripheral surface and the inner peripheral surface 32*a* (excluding the flange 32*b*) of the second cover 32. The three lock mechanisms 8 have the same configuration.

Each lock mechanism 8 includes a switching lever 8*a* (see FIG. 4) arranged on the top plate 21 inside the first cover 22, and switches between the coupled state and the uncoupled state depending on the position of the switching lever 8*a*. Each lock mechanism 8 includes a shaft 8*b* penetrating the top plate 21 in the upward-downward direction, an engagement portion 8*c* provided at a lower end of the shaft 8*b*, and an insertion port 8*d* penetrating the flange 32*b* of the second cover 32 in the upward-downward direction.

The shaft 8*b* passes through an insertion hole 21*b* of the top plate 21 and the insertion port 8*d*. The shaft 8*b* is inserted into a cylindrical sleeve 8*e* and is provided rotatably around a central axis A1. An upper end of the shaft 8*b* is exposed above the top plate 21, and the switching lever 8*a* is rotatably attached to the shaft 8*b*. The switching lever 8*a* is rotatable around a horizontal axis A2 perpendicular to the central axis A1 of the shaft 8*b*, and can be switched between a state in which it is tilted in a direction along the top plate 21 and a state in which it is raised so as to rise upward from the top plate 21. The shaft 8*b* can be rotated around the central axis A1 by turning the switching lever 8*a* in the raised state. When the switching lever 8*a* is tilted, the switching lever 8*a* and the shaft 8*b* cannot rotate around the central axis A1, and the rotation positions of the switching lever 8*a* and the shaft 8*b* around the central axis A1 can be fixed.

The lower end of the shaft 8*b* passes through the insertion port 8*d* and protrudes downward of the flange 32*b*. The engagement portion 8*c* is fixed to a portion of the shaft 8*b* protruding downward of the flange 32*b*. The switching lever 8*a* moves the shaft 8*b* up and down in conjunction with an angle around the horizontal axis A2. When the switching lever 8*a* is tilted, the shaft 8*b* and the engagement portion 8*c* move upward, and the engagement portion 8*c* is pressed upward against the lower surface of the flange 32*b* such that the top plate 21 and the flange 32*b* are sandwiched between a base of the switching lever 8*a* and the engagement portion 8*c*, and the first assembly 2*a* and the second assembly 2*b* are coupled to each other. When the switching lever 8*a* is raised, the shaft 8*b* and the engagement portion 8*c* move downward, and the engagement portion 8*c* moves downward away from the lower surface of the flange 32*b* such that the shaft 8*b* and the engagement portion 8*c* can be freely rotated around the central axis A1.

Figure 6:
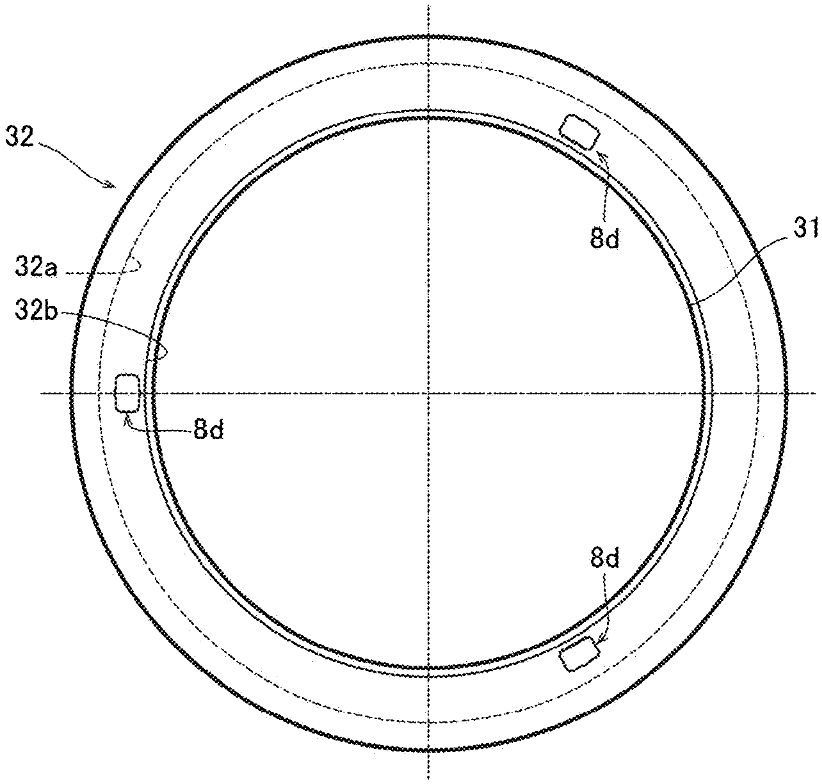
FIG. 6 is a schematic plan view of a second cover for illustrating an arrangement of insertion ports.

As shown in FIG. 6, three insertion ports 8*d* for the three lock mechanisms 8 are provided at substantially equal angles along the circumferential direction on the flange 32*b* of the second cover 32.

Figure 7:
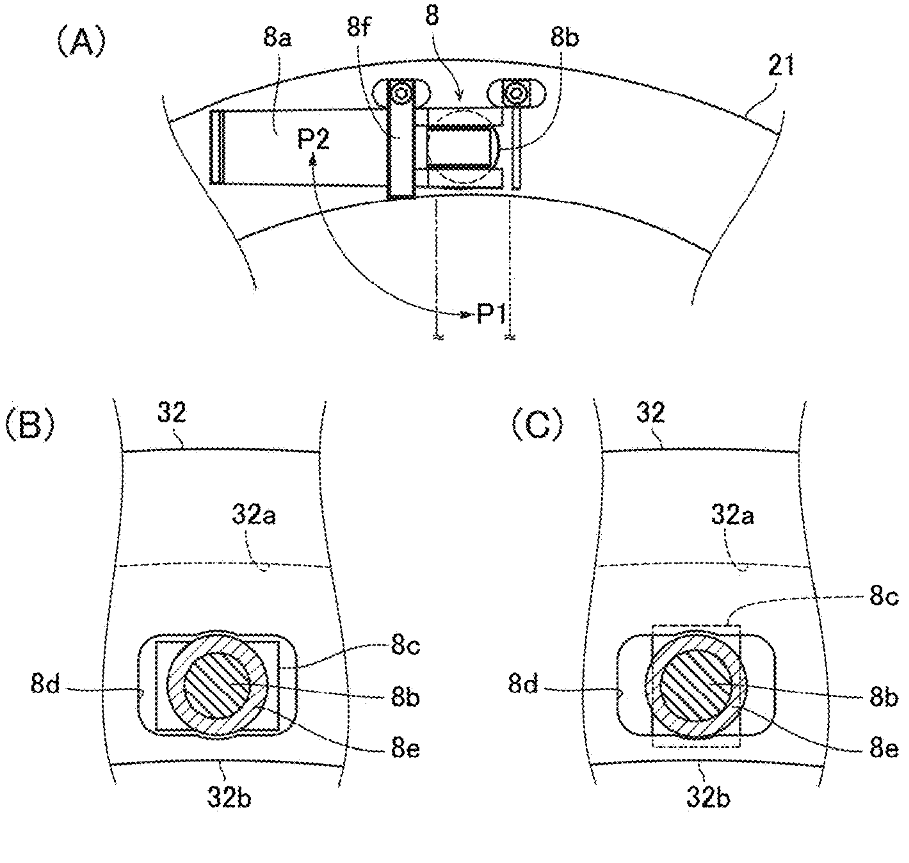
FIG. 7A is a diagram for schematically illustrating an operation on a switching lever to switch the state of the lock mechanism.
FIG. 7B is a diagram for schematically illustrating an engagement portion in an uncoupled state.
FIG. 7C is a diagram for schematically illustrating the engagement portion in a coupled state.

As shown in FIG. 7B, each of the insertion ports 8*d* on the flange 32*b* has a rectangular shape with different vertical and horizontal lengths. The engagement portion 8*c* also has a rectangular outer shape that is one size smaller than the insertion port 8*d*. The length of the long side of the engagement portion 8*c* is greater than the length of the short side of the insertion port 8*d*. Therefore, when the switching lever 8*a* is turned to a first angle P1 at which the switching lever 8*a* faces the radially inward direction of the top plate 21 (see a two-dot chain line in FIG. 7A), the shaft 8*b* rotates such that the long side direction of the engagement portion 8*c* is oriented in the long side direction of the insertion port 8*d*, as shown in FIG. 7B, and the engagement portion 8*c* becomes passable through the insertion port 8*d*. Thus, the shaft 8*b* can be inserted into the insertion port 8*d* or removed from the insertion port 8*d*. When the switching lever 8*a* is turned to a second angle P2 at which the switching lever 8*a* faces the circumferential direction of the top plate 21 with the shaft 8*b* inserted into the insertion port 8*d* (see a solid line in FIG. 7A), the shaft 8*b* rotates such that the long side direction of the engagement portion 8*c* is oriented in the short side direction of the insertion port 8*d*, as shown in FIG. 7C, and the engagement portion 8*c* gets caught on the edge of the insertion port 8*d* and becomes impassable.

When the lock mechanism 8 is switched from the coupled state to the uncoupled state, the switching lever 8*a* is first switched from a tilted state to a raised state. This allows the engagement portion 8*c* to be spaced apart from the lower surface of the flange 32*b* and rotate. Next, the switching lever 8*a* in the raised state is turned from the second angle P2 to the first angle P1. This allows the engagement portion 8*c* to pass through the insertion port 8*d*. The state in which the switching lever 8*a* is oriented at the first angle P1 is the uncoupled state of the lock mechanism 8. In the uncoupled state, the engagement portion 8*c* does not engage with the flange 32*b* regardless of whether the switching lever 8*a* is raised or tilted, and thus there is no difference whether the switching lever 8*a* is raised or tilted.

When the lock mechanism 8 is switched from the uncoupled state to the coupled state, the switching lever 8*a* is turned from the first angle P1 to the second angle P2 while being still raised. This causes the engagement portion 8*c* to be oriented such that it cannot pass through the insertion port 8*d*. Next, the switching lever 8*a* oriented at the second angle P2 is switched from the raised state to the tilted state. This causes the engagement portion 8*c* to move upward and be caught on the edge of the insertion port 8*d*, and the top plate 21 and the flange 32*b* are sandwiched between the base of the switching lever 8*a* and the engagement portion 8*c*. Thus, the lock mechanism 8 enters the coupled state. The state in which the switching lever 8*a* is oriented at the second angle P2 and tilted is the coupled state of the lock mechanism 8.

The switching operation can be easily and quickly done by simply combining the switching of the switching lever 8*a* between the tilted state and the raised state and the operation of rotating the switching lever 8*a* by about 90 degrees (from the short side direction to the long side direction of the insertion port 8*d*) between the first angle P1 and the second angle P2 shown in FIG. 7A. In the coupled state, the engagement portion 8*c* is pressed against the lower surface of the flange 32*b*, and thus the switching lever 8*a* (shaft 8*b*) cannot rotate unless it is raised, and the coupled state is maintained.

With this configuration, when the switching lever 8*a* is in a locked position, the engagement portion 8*c* is located in a position in which it engages with the edge of the insertion port 8*d* such that the lock mechanism 8 is in the coupled state. When the switching lever 8*a* is in an unlocked position, the engagement portion 8*c* is located in a position in which it does not engage with the edge of the insertion port 8*d* such that the lock mechanism 8 is in the uncoupled state. The locked position is the position of the switching lever 8*a* when the switching lever 8*a* is oriented at the second angle P2 and tilted, and the unlocked position is the position of the switching lever 8*a* when the switching lever 8*a* is oriented at the first angle P1.

As shown in FIG. 7A, a malfunction prevention component 8*f* is provided on one circumferential side of the top plate 21 with respect to the lock mechanism 8. The malfunction prevention component 8*f* is a hook-shaped component that can engage with the upper surface of the switching lever 8*a* after the switching lever 8*a* is tilted in a P2 direction (after the lock mechanism 8 enters the coupled state). The switching lever 8*a* can be switched from the locked position (tilted state) to the raised state by moving the malfunction prevention component 8*f* to a position to which it is retracted from the upper surface of the switching lever 8*a*. Therefore, the malfunction prevention component 8*f* prevents the switching lever 8*a* from being unintentionally switched from the tilted state to the raised state.

Processing Operation of Substrate Processing Apparatus

An overview of the operation of the substrate processing apparatus 100 according to this embodiment during substrate processing is now described. The operation of the substrate processing apparatus 100 is controlled by a controller (not shown). When the substrate processing apparatus 100 is operating, the lock mechanism 8 is maintained in the coupled state.

As shown in FIG. 1, the substrate W is placed on the susceptor 12 by the transport device 200. The substrate W is attracted to a placement surface by an electrostatic chuck (not shown) provided on the susceptor 12.

Next, a processing gas is introduced into the closed space 40, and high-frequency power is applied to form plasma. First, the processing gas is supplied from the gas supply device 4 into the plasma generation chamber 31 via the valve mechanism 23, and high-frequency power is supplied from the high-frequency power source 5 to the coil 33. Thus, the processing gas is excited by the high-frequency power to become plasma.

Furthermore, high-frequency power is applied to the susceptor 12 by the high-frequency power source 7. Thus, a potential difference (bias potential) occurs between the susceptor 12 and the plasma in the closed space 40. Consequently, ions in the plasma collide with the substrate W due to the bias potential, or radicals in the plasma chemically react with species to be etched in the substrate W such that the substrate W is etched.

An overview of maintenance of the substrate processing apparatus 100 is now described.

Maintenance of Lower Chamber

Figure 8:
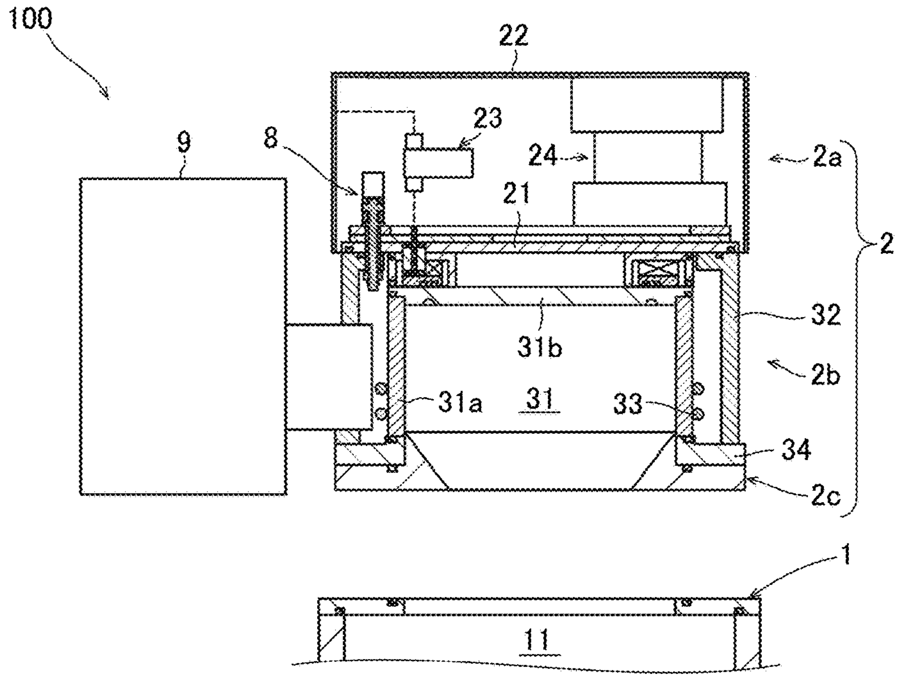
FIG. 8 is a sectional view schematically showing the upper chamber raised in the coupled state.

During maintenance on the inside of the lower chamber 1, the worker raises the entire upper chamber 2 using the lift mechanism 3 (see FIG. 2) while maintaining the three lock mechanisms 8 in the coupled state, as shown in FIG. 8. Thus, the entire upper chamber 2 moves upward away from the lower chamber 1, and the upper surface of the lower chamber 1 is opened. The worker can easily do maintenance on the inside of the reaction chamber 11. After the work is completed, the upper chamber 2 is returned from the raised position to the lowered position by the lift mechanism 3, and the upper chamber 2 and the lower chamber 1 are coupled to each other.

Since the third assembly 2*c* is provided in the upper chamber 2, the entire upper chamber 2 can be separated from the lower chamber 1, as shown in FIG. 8, with the bolts connecting the support plate 34 of the second assembly 2*b* to the third assembly 2*c* attached, and the first assembly 2*a* and the second assembly 2*b* can be separated from the third assembly 2*c* and the lower chamber 1 by removing the bolts connecting the support plate 34 to the third assembly 2*c*.

Maintenance of Second Assembly

During maintenance on the inside of the second assembly 2*b*, the worker switches the three lock mechanisms 8 from the coupled state to the uncoupled state, and then raises the upper chamber 2 using the lift mechanism 3.

Figure 9:
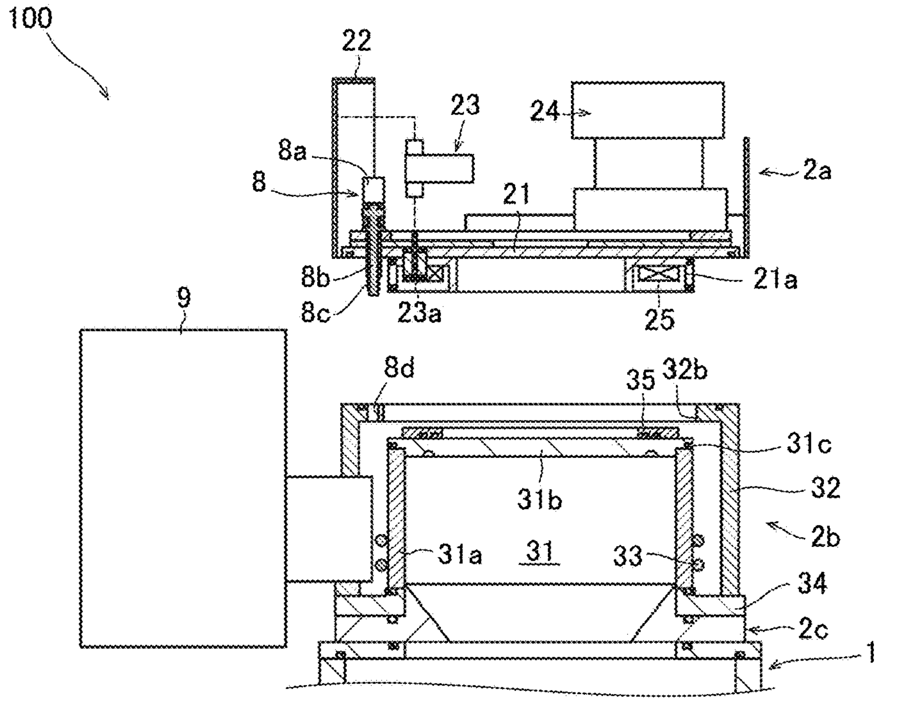
FIG. 9 is a sectional view schematically showing the first assembly raised in the uncoupled state.

As shown in FIG. 9, the worker removes the separable portion 22*a* (see FIG. 2) of the first cover 22 to expose each lock mechanism 8 (switching lever 8*a*) on the top plate 21. The worker moves the malfunction prevention component 8*f* of each lock mechanism 8 to the position to which the malfunction prevention component 8*f* is retracted from the upper surface of the switching lever 8*a*, and then grips the switching lever 8*a* of each lock mechanism 8 and switches the switching lever 8*a* from the locked position to the unlocked position. Consequently, each lock mechanism 8 is switched to the uncoupled state, and the first assembly 2*a* and the second assembly 2*b* can be separated from each other.

The worker raises the first assembly 2*a* using the lift mechanism 3 (see FIG. 2). In this case, the first assembly 2*a* and the second assembly 2*b* are not coupled to each other, and thus only the first assembly 2*a* moves upward away from the second assembly 2*b*. Thus, the upper surface of the second cover 32 is opened, and the top board 31*b* of the plasma generation chamber 31 is exposed.

The worker removes and separates the top board 31*b* from the sidewall 31*a*. Thus, the inside of the plasma generation chamber 31 (sidewall 31*a*) is opened, and thus the worker can easily do maintenance on the inside of the plasma generation chamber 31. After the work is completed, the worker attaches the top board 31*b* to the upper end of the sidewall 31*a*. The worker can directly attach only the top board 31*b* to the upper end of the sidewall 31*a* without using the lift mechanism 3 to raise or lower anything.

Thereafter, the first assembly 2*a* is returned from the raised position to the lowered position by the lift mechanism 3 (see FIG. 2), and the first assembly 2*a* is placed on the second assembly 2*b*. At this time, the protrusion 21*a* of the top plate 21 presses the upper surface of the top board 31*b* from above. Thus, the sealing performance between the top board 31*b* and the sidewall 31*a* is improved. Furthermore, a seal is ensured between the attachment 23*a* and the distributor 35 due to the pressing force.

Moreover, when the first assembly 2*a* is placed on the second assembly 2*b*, the shaft 8*b* and the engagement portion 8*c* of the lock mechanism 8 pass through the inside of the insertion port 8*d* of the flange 32*b*, and the engagement portion 8*c* is arranged under the lower surface of the flange 32*b*. The worker grips the switching lever 8*a* of each lock mechanism 8 and switches the switching lever 8*a* from the unlocked position to the locked position. Consequently, each lock mechanism 8 is switched to the coupled state, and the first assembly 2*a* and the second assembly 2*b* are fixed to each other. Finally, the worker closes the first cover 22 to finish the maintenance. Although it is described that the first assembly 2*a* is raised and lowered in a state in which the shaft 8*b* and the engagement portion 8*c* of the lock mechanism 8 are attached to the first assembly 2*a*, the shaft 8*b* and the engagement portion 8*c* may be removed from the first assembly 2*a* before the first assembly 2*a* is raised, the first assembly 2*a* may be lowered, and the shaft 8*b* and the engagement portion 8*c* may be inserted from the first assembly 2*a* after the first assembly 2*a* is placed on the second assembly 2*b*.

Maintenance of First Assembly

Maintenance can be done on the upper surface side of the first assembly 2*a* in the lowered position by opening the first cover 22 without the lift mechanism 3 raising or lowering anything. Maintenance work can also be done by moving the upper chamber 2 to the raised position in the coupled state or by moving only the first assembly 2*a* to the raised position in the uncoupled state, similarly to the above. After the work, the worker attaches the separable portion 22*a* to the first cover 22 to finish the maintenance.

Advantages of this Embodiment

According to this embodiment, the following advantages are achieved.

Figure 10:
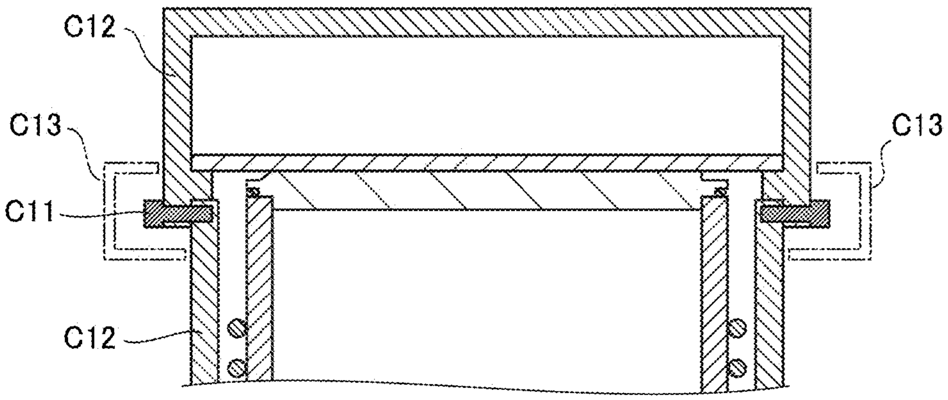
FIG. 10 is a schematic view of Comparative Example 1 in which a lock mechanism is provided on the outer surface of an apparatus.

In the substrate processing apparatus 100 according to this embodiment, as described above, the first cover 22 and the second cover 32 are provided on the first assembly 2*a* and the second assembly 2*b* of the upper chamber 2, respectively, and the lock mechanisms 8 are provided on a position closer to the inner periphery than the peripheral side of the first cover 22 of the first assembly 2*a*. Accordingly, the first cover 22 can protect the lock mechanisms 8 while the first cover 22 and the second cover 32 protect the high-temperature portions. Thus, the lock mechanisms 8 are not exposed on the outer surface of the first cover 22, and thus it is not necessary to separately provide a protective cover or the like for the lock mechanisms 8. That is, when lock mechanisms C11 are exposed on the outer peripheral surface of a cover C12, as in Comparative Example 1 shown in FIG. 10, it is necessary to separately provide a cover member C13 as shown by a two-dot chain line in order to prevent unintentional contact with the lock mechanisms C11. Therefore, due to the cover member C13, the outer diameter dimension of the apparatus increases, and the configuration of the apparatus becomes complex. In this embodiment, the first cover 22 also functions as a cover for the lock mechanisms 8, and thus as compared with the comparative example shown in FIG. 10, an increase in the outer diameter dimension of the apparatus can be reduced or prevented while the configuration of the apparatus does not become complex.

Figure 11:
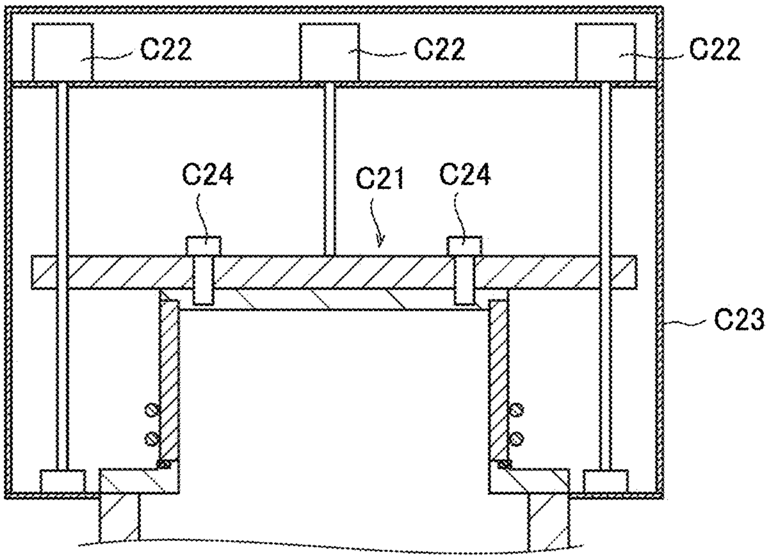
FIG. 11 is a schematic view of Comparative Example 2 in which an upper chamber and a lift mechanism are housed in a cover.

According to this embodiment, as described above, the first cover 22 and the second cover 32 are provided separately, and the first assembly 2*a* is coupled to the lift mechanism 3 from the outside of the first cover 22. Accordingly, as compared with a configuration in which an upper chamber C21 is housed together with a lift mechanism C22 within an upper cover C23, as in Comparative Example 2 shown in FIG. 11, spaces to be ensured within the covers (the first cover 22 and the second cover 32) can be reduced, and thus the dimensions (volumes) of the first cover 22 and the second cover 32 can be reduced. During maintenance, the first assembly 2*a* and the second assembly 2*b* can be coupled or uncoupled by operating the lock mechanisms 8. In this case, in Comparative Example 2 shown in FIG. 11, the lift mechanism C22 etc. housed in the upper cover C23 tend to interfere with the uncoupling and coupling operations of a lock mechanism C24 in the upper cover C23. In contrast, in this embodiment, the lift mechanism 3 is not located in the first cover 22, and thus it is not necessary to operate the lock mechanism 8 through a gap between components of the lift mechanism. Therefore, the lift mechanism 3 does not interfere with an operation on the lock mechanism 8. Consequently, the operability of the lock mechanism 8 can be improved particularly within the first cover 22. Thus, according to this embodiment, it is possible to reduce or prevent an increase in the outer diameter dimension of the apparatus while ensuring protective structures for the high-temperature portions and the lock mechanisms 8 and improve the operability of the lock mechanism 8.

According to this embodiment, as described above, the first assembly 2*a* includes the valve mechanism 23, the cooling mechanism 24, and the heating mechanism 25, all of which are provided on the top plate 21, and the second assembly 2*b* includes, on the inner peripheral side of the second cover 32, the cylindrical sidewall 31*a* to define the inner peripheral surface of the plasma generation chamber 31, the top board 31*b* to define the ceiling surface of the plasma generation chamber 31, and the coil 33 provided around the plasma generation chamber 31 to generate a magnetic field to turn the processing gas in the plasma generation chamber 31 into plasma. Accordingly, when the first assembly 2*a* is raised, the mechanisms (the valve mechanism 23, the cooling mechanism 24, and the heating mechanism 25) mounted on the first assembly 2*a* can be collectively separated from the second assembly 2*b*. When the first assembly 2*a* is separated from the second assembly 2*b*, the top board 31*b* and the sidewall 31*a* of the plasma generation chamber 31, and the coil 33 remain in the second assembly 2*b*. If the top board 31*b* is provided on the first assembly 2*a*, the top board 31*b* and the sidewall 31*a* must be sealed (hermetically sealed) when the first assembly 2*a* and the second assembly 2*b* are separated and united by the lift mechanism 3, and thus high positional accuracy is required for the raising and lowering operation of the lift mechanism 3. In contrast, in this embodiment, the first assembly 2*a* can be united with the second assembly 2*b* after the top board 31*b* is attached to the sidewall 31*a*, and thus high positional accuracy is not required in alignment by the lift mechanism 3 to ensure a seal (airtight seal) between the top board 31*b* and the sidewall 31*a*.

According to this embodiment, as described above, the lock mechanism 8 is operable to switch between the coupled state in which the first assembly 2*a* and the second assembly 2*b* are coupled to each other such that both the first assembly 2*a* and the second assembly 2*b* are separable from the lower chamber 1 by the lift mechanism 3 and the uncoupled state in which the first assembly 2*a* and the second assembly 2*b* are not coupled to each other such that the first assembly 2*a* is separable from the second assembly 2*b* and the lower chamber 1 by the lift mechanism 3. Accordingly, the coupled state and the uncoupled state can be switched by simply operating the lock mechanism 8.

According to this embodiment, as described above, the lock mechanism 8 includes the switching lever 8*a* on the top plate 21 within the first cover 22, and is operable to switch between the coupled state and the uncoupled state depending on the position of the switching lever 8*a*. Accordingly, unlike a configuration that locks with a bolt or the like, the lock mechanism 8 can be switched between the coupled state and the uncoupled state extremely easily and quickly by operating the switching lever 8*a*.

According to this embodiment, as described above, the lock mechanism 8 is provided on a position closer to the inner periphery than the peripheral side of the second cover 32 of the second assembly 2*b*. The second cover 32 includes the flange 32*b* protruding inward from the inner peripheral surface 32*a* of the second cover 32. The lock mechanism 8 includes the shaft 8*b* penetrating the top plate 21 in the upward-downward direction, the engagement portion 8*c* at the lower end of the shaft 8*b*, and the insertion port 8*d* penetrating the flange 32*b* of the second cover 32 in the upward-downward direction. When the switching lever 8*a* is in the locked position, the engagement portion 8*c* is located in the position in which the engagement portion 8*c* engages with the edge of the insertion port 8*d* such that the lock mechanism 8 is in the coupled state, and when the switching lever 8*a* is in the unlocked position, the engagement portion 8*c* is located in the position in which the engagement portion 8*c* does not engage with the edge of the insertion port 8*d* such that the lock mechanism 8 is in the uncoupled state. Accordingly, the lock mechanism 8 can be achieved with a simple configuration in which the shaft 8*b* is inserted into the insertion port 8*d* to change the engagement state between the engagement portion 8*c* and the edge of the insertion port 8*d*. Furthermore, the lock mechanism 8 can be made into an elongated shaft-shaped structure that extends in the upward-downward direction as a whole, and thus even when the lock mechanism 8 is provided on the inner peripheral side of the first cover 22 and the second cover 32, an increase in the outer diameter dimensions of the first cover 22 and the second cover 32 can be effectively reduced or prevented.

According to this embodiment, as described above, the lift mechanism 3 is coupled to the top plate 21 from the outside of the upper chamber 2. For example, when the first cover 22 is coupled to the lift mechanism 3, it becomes necessary to ensure that the first cover 22 has a rigidity required to support the weight, and the first cover 22 is likely to become large in order to ensure the rigidity. In contrast, in the above configuration, the top plate 21 functions as a component that ensures the rigidity of the first assembly 2*a*, and thus the size and weight of the first cover 22 can be reduced.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the example of the lock mechanism 8 of the type in which the engagement portion 8*c* provided on the shaft 8*b* is engaged with the edge of the insertion port 8*d* has been shown in the aforementioned embodiment, the present invention is not limited to this. In the present invention, the structure of the lock mechanism to couple the first assembly 2*a* and the second assembly 2*b* to each other may be a bolt (fastening means), a pin, a key, or a buckle (engagement means), for example. Furthermore, the lock mechanism 8 may not be of the type in which the switching lever 8*a* is operated.

While the example in which the lift mechanism 3 is coupled to the top plate 21 has been shown in the aforementioned embodiment, in the present invention, the lift mechanism 3 may be coupled to the first cover 22.

While the example in which the valve mechanism 23, the cooling mechanism 24, and the heating mechanism 25 are provided on the top plate 21 (first assembly 2*a*), and the sidewall 31*a* and the top board 31*b* that define the plasma generation chamber 31 are provided on the second assembly 2*b* has been shown in the aforementioned embodiment, the present invention is not limited to this. In the present invention, as shown in FIG. 12, the top board 31*b* may be provided on the first assembly 2*a* (top plate 21) side, and the top board 31*b* may be separated from the sidewall 31*a* by separating the first assembly 2*a* from the second assembly 2*b*, for example.

Figure 12:
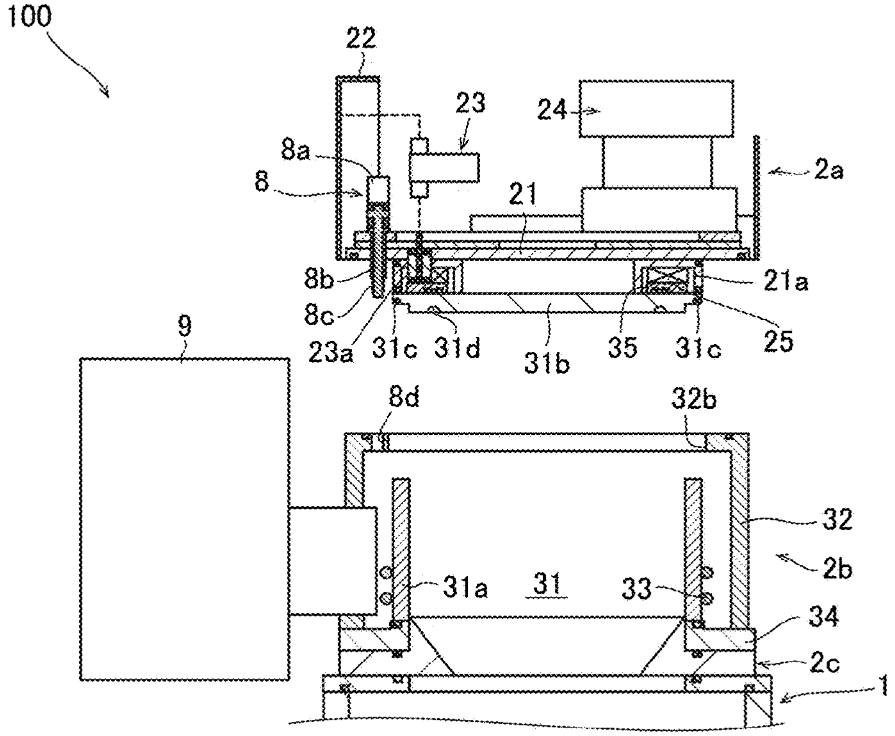
FIG. 12 is a sectional view schematically showing a state in which a first assembly and a second assembly are separated from each other in a modified example.

Specifically, in a modified example shown in FIG. 12, a first assembly 2*a* includes a top plate 21, a first cover 22, and a top board 31*b* to define the ceiling surface of a plasma generation chamber 31. In this modified example, the top board 31*b* is fixed to the lower surface of a protrusion 21*a* of the top plate 21 by bolts (not shown) or the like. A second assembly 2*b* includes a sidewall 31*a* to define the inner peripheral surface of the plasma generation chamber 31, and a second cover 32 to cover the outer periphery of the plasma generation chamber 31, and the second assembly 2*b* does not include the top board 31*b*. The remaining configurations of a substrate processing apparatus 100 according to the modified example are similar to those of the above embodiment.

In this modified example, when each lock mechanism 8 is switched to an uncoupled state and the first assembly 2*a* is raised (separated) from the second assembly 2*b* by a lift mechanism 3 (see FIG. 2), the top board 31*b* is raised together with the first assembly 2*a* such that the interior of the plasma generation chamber 31 is opened. When the first assembly 2*a* is returned from the raised position to the lowered position by the lift mechanism 3, the top board 31*b* is placed on the sidewall 31*a* such that the plasma generation chamber 31 is closed by the top board 31*b*. Therefore, by simply raising and lowering the first assembly 2*a* with the lift mechanism 3, the first assembly 2*a* and the second assembly 2*b* can be separated and united, and the plasma generation chamber 31 can be opened and closed. Furthermore, when the top board 31*b* is hardly contaminated by the process and does not need to be cleaned, it is only necessary to raise and lower the entire first assembly 2*a* without removing the top board 31*b* alone. This also leads to improved efficiency in maintenance work. The remaining advantages of the substrate processing apparatus 100 according to this modified example are similar to those of the above embodiment.

Figure 13:
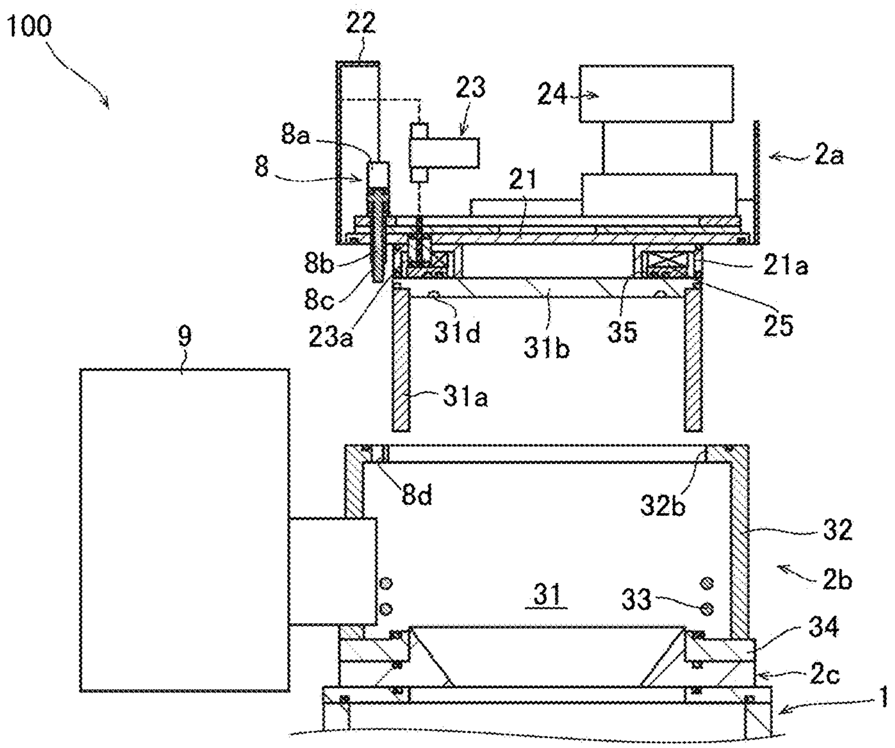
FIG. 13 is a sectional view schematically showing a state in which a first assembly and a second assembly are separated from each other in another modified example.

Thus, in the present invention, the substrate processing apparatus 100 may include a configuration in which the second assembly 2*b* includes the sidewall 31*a* to define the inner peripheral surface of the plasma generation chamber 31, and the top board 31*b* that defines the ceiling surface of the plasma generation chamber 31 is provided on the first assembly 2*a* (see FIG. 12) or the second assembly 2*b* (see FIG. 9). Furthermore, as shown in FIG. 13, both the sidewall 31*a* and the top board 31*b* may be provided on the first assembly 2*a*. In other words, in the present invention, the substrate processing apparatus 100 may include a configuration in which the sidewall 31*a* and the top board 31*b* that define the plasma generation chamber 31 are both provided on either the first assembly 2*a* or the second assembly 2*b* (see FIG. 9 or FIG. 13), or may include a configuration in which the sidewall 31*a* and the top board 31*b* are separately provided on the first assembly 2*a* and the second assembly 2*b* (see FIG. 12).

In addition, in the present invention, one of the sidewall 31*a* and the top board 31*b* may be provided on either the first assembly 2*a* or the second assembly 2*b*, and the other of the sidewall 31*a* and the top board 31*b* may be provided on a member other than the first assembly 2*a* and the second assembly 2*b*. Alternatively, the sidewall 31*a* and the top board 31*b* of the plasma generation chamber 31 may not be provided on the first assembly 2*a* or the second assembly 2*b*, but may be provided on a member other than the first assembly 2*a* and the second assembly 2*b*. For example, the sidewall 31*a* or both the sidewall 31*a* and the top board 31*b* may be provided on the third assembly 2*c*.

While the example in which the upper chamber 2 includes the third assembly 2*c* has been shown in the aforementioned embodiment, the present invention is not limited to this. In the present invention, the upper chamber 2 may include the first assembly 2*a* and the second assembly 2*b* without including the third assembly 2*c*.

In the aforementioned embodiment (see FIG. 6), the example in which the flange 32*b* of the second cover 32 is provided in an annular shape around the entire circumference of the second cover 32 has been shown. Alternatively, the flange 32*b* may be provided only around the insertion port 8*d*. In this case, the ventilation between the atmospheric region inside the second cover 32 and the inside of the first cover 22 can be improved, and thus the cooling mechanism 24 can effectively release heat.

While the example in which the cooling mechanism 24 is an air-cooling type cooling mechanism has been shown in the aforementioned embodiment, the cooling mechanism 24 may be a water-cooling type cooling mechanism that uses cooling water, or the cooling mechanism 24 may use both cooling with air and cooling with cooling water.

While the example in which the lock mechanism 8 is provided on a position closer to the inner periphery than the peripheral side of the second cover 32 of the second assembly 2*b* has been shown in the aforementioned embodiment, the present invention is not limited to this. For example, the lock mechanism may be a bolt that connects the first assembly 2*a* to the second assembly 2*b*, the bolt may be inserted through an insertion hole provided in the top plate 21, and a threaded portion of the bolt may be engaged with and fastened to a screw hole or a nut provided in the second cover 32. In this case, a transverse groove may be provided in the outer wall of the second cover 32, and the nut may be embedded into the second cover 32 from the outside so as to be exposed to the outside of the second cover 32 outside the inner peripheral surface of the second cover 32. Even when the nut is used, an unnecessary contact with the nut during ascending or descending is not made (even when a contact with the nut is made, unlocking is not done because the contact is not on the lock operating side), but the configuration according to the above embodiment is preferable because it is possible to more reliably prevent an erroneous operation and there is no risk of the nut falling out of the groove at the time of unlocking, as occurs when the nut is used.

Furthermore, the substrate processing apparatus according to the present invention may be a substrate processing apparatus other than an etching apparatus, such as a film forming apparatus.

What is claimed is:

1. A substrate processing apparatus comprising:
a lower chamber including a reaction chamber to process a substrate;
an upper chamber to cover an upper portion of the lower chamber; and
a lift mechanism to attach and detach the upper chamber to and from the lower chamber; wherein
the upper chamber includes a first assembly on an upper side, a second assembly on a lower surface of the first assembly, and a lock mechanism to releasably couple the first assembly to the second assembly;
the first assembly includes a top plate and a first cover to openably cover an upper surface of the top plate, and is coupled to the lift mechanism from an outside of the first cover;
the second assembly includes a plasma generation chamber coupled to the reaction chamber to define a closed space, and a cylindrical second cover to cover an outer periphery of the plasma generation chamber; and
the lock mechanism is on a position closer to an inner periphery than a peripheral side of the first cover of the first assembly.

2. A substrate processing apparatus comprising:
a lower chamber including a reaction chamber to process a substrate;
an upper chamber to cover an upper portion of the lower chamber; and
a lift mechanism to attach and detach the upper chamber to and from the lower chamber; wherein
the upper chamber includes a first assembly on an upper side, a second assembly on a lower surface of the first assembly, and a lock mechanism to releasably couple the first assembly to the second assembly;
the first assembly includes a top plate, a first cover to openably cover an upper surface of the top plate, and a top board to define a ceiling surface of a plasma generation chamber coupled to the reaction chamber to define a closed space, and is coupled to the lift mechanism from an outside of the first cover;
the second assembly includes a cylindrical sidewall to define an inner peripheral surface of the plasma generation chamber, and a cylindrical second cover to cover an outer periphery of the plasma generation chamber; and
the lock mechanism is on a position closer to an inner periphery than a peripheral side of the first cover of the first assembly.

3. A substrate processing apparatus comprising:
a lower chamber including a reaction chamber to process a substrate;
an upper chamber to cover an upper portion of the lower chamber; and
a lift mechanism to attach and detach the upper chamber to and from the lower chamber; wherein
the upper chamber includes a first assembly on an upper side, a second assembly on a lower surface of the first assembly, and a lock mechanism to releasably couple the first assembly to the second assembly;
the first assembly includes a top plate and a first cover to openably cover an upper surface of the top plate, and is coupled to the lift mechanism from an outside of the first cover;
the second assembly includes a cylindrical second cover to cover an outer periphery of a plasma generation chamber coupled to the reaction chamber to define a closed space; and
the lock mechanism is on a position closer to an inner periphery than a peripheral side of the first cover of the first assembly.

4. The substrate processing apparatus according to claim 1, wherein
the first assembly includes a valve mechanism, a cooling mechanism, and a heating mechanism, all of which are on the top plate; and
the second assembly includes, on an inner peripheral side of the second cover, a coil around the plasma generation chamber to generate a magnetic field to turn a processing gas in the plasma generation chamber into plasma.

5. The substrate processing apparatus according to claim 1, wherein the lock mechanism is operable to switch between a coupled state in which the first assembly and the second assembly are coupled to each other such that both the first assembly and the second assembly are separable from the lower chamber by the lift mechanism and an uncoupled state in which the first assembly and the second assembly are not coupled to each other such that the first assembly is separable from the second assembly and the lower chamber by the lift mechanism.

6. The substrate processing apparatus according to claim 5, wherein the lock mechanism includes a switching lever on the top plate within the first cover, and is operable to switch between the coupled state and the uncoupled state depending on a position of the switching lever.

7. The substrate processing apparatus according to claim 6, wherein
the lock mechanism is on a position closer to an inner periphery than a peripheral side of the second cover of the second assembly;
the second cover includes a flange protruding inward from an inner peripheral surface of the second cover;
the lock mechanism includes a shaft penetrating the top plate in an upward-downward direction, an engagement portion at a lower end of the shaft, and an insertion port penetrating the flange of the second cover in the upward-downward direction;
when the switching lever is in a locked position, the engagement portion is located in a position in which the engagement portion engages with an edge of the insertion port such that the lock mechanism is in the coupled state, and
when the switching lever is in an unlocked position, the engagement portion is located in a position in which the engagement portion does not engage with the edge of the insertion port such that the lock mechanism is in the uncoupled state.

8. The substrate processing apparatus according to claim 1, wherein the lift mechanism is coupled to the top plate from an outside of the upper chamber.

9. The substrate processing apparatus according to claim 2, wherein the first assembly includes a valve mechanism, a cooling mechanism, and a heating mechanism, all of which are on the top plate; and the second assembly includes, on an inner peripheral side of the second cover, a coil around the plasma generation chamber to generate a magnetic field to turn a processing gas in the plasma generation chamber into plasma.

10. The substrate processing apparatus according to claim 3, wherein the first assembly includes a valve mechanism, a cooling mechanism, and a heating mechanism, all of which are on the top plate; and the second assembly includes, on an inner peripheral side of the second cover, a coil around the plasma generation chamber to generate a magnetic field to turn a processing gas in the plasma generation chamber into plasma.

11. The substrate processing apparatus according to claim 2, wherein the lock mechanism is operable to switch between a coupled state in which the first assembly and the second assembly are coupled to each other such that both the first assembly and the second assembly are separable from the lower chamber by the lift mechanism and an uncoupled state in which the first assembly and the second assembly are not coupled to each other such that the first assembly is separable from the second assembly and the lower chamber by the lift mechanism.

12. The substrate processing apparatus according to claim 3, wherein the lock mechanism is operable to switch between a coupled state in which the first assembly and the second assembly are coupled to each other such that both the first assembly and the second assembly are separable from the lower chamber by the lift mechanism and an uncoupled state in which the first assembly and the second assembly are not coupled to each other such that the first assembly is separable from the second assembly and the lower chamber by the lift mechanism.

13. The substrate processing apparatus according to claim 11, wherein the lock mechanism includes a switching lever on the top plate within the first cover, and is operable to switch between the coupled state and the uncoupled state depending on a position of the switching lever.

14. The substrate processing apparatus according to claim 12, wherein the lock mechanism includes a switching lever on the top plate within the first cover, and is operable to switch between the coupled state and the uncoupled state depending on a position of the switching lever.

15. The substrate processing apparatus according to claim 13, wherein the lock mechanism is on a position closer to an inner periphery than a peripheral side of the second cover of the second assembly;

the second cover includes a flange protruding inward from an inner peripheral surface of the second cover;

the lock mechanism includes a shaft penetrating the top plate in an upward-downward direction, an engagement portion at a lower end of the shaft, and an insertion port penetrating the flange of the second cover in the upward-downward direction;

when the switching lever is in a locked position, the engagement portion is located in a position in which the engagement portion engages with an edge of the insertion port such that the lock mechanism is in the coupled state, and when the switching lever is in an unlocked position, the engagement portion is located in a position in which the engagement portion does not engage with the edge of the insertion port such that the lock mechanism is in the uncoupled state.

16. The substrate processing apparatus according to claim 14, wherein the lock mechanism is on a position closer to an inner periphery than a peripheral side of the second cover of the second assembly;

the second cover includes a flange protruding inward from an inner peripheral surface of the second cover;

the lock mechanism includes a shaft penetrating the top plate in an upward-downward direction, an engagement portion at a lower end of the shaft, and an insertion port penetrating the flange of the second cover in the upward-downward direction;

when the switching lever is in a locked position, the engagement portion is located in a position in which the engagement portion engages with an edge of the insertion port such that the lock mechanism is in the coupled state, and when the switching lever is in an unlocked position, the engagement portion is located in a position in which the engagement portion does not engage with the edge of the insertion port such that the lock mechanism is in the uncoupled state.

17. The substrate processing apparatus according to claim 2, wherein the lift mechanism is coupled to the top plate from an outside of the upper chamber.

18. The substrate processing apparatus according to claim 3, wherein the lift mechanism is coupled to the top plate from an outside of the upper chamber.

* * * * *